(12) United States Patent
Miller et al.

(10) Patent No.: US 7,345,947 B2
(45) Date of Patent: Mar. 18, 2008

(54) MEMORY ARRAY LEAKAGE REDUCTION CIRCUIT AND METHOD

(75) Inventors: Jeffrey L. Miller, Vancouver, WA (US); Mahadevamurty Nemani, Hillsboro, OR (US); James W. Conary, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/516,209

(22) Filed: Sep. 5, 2006

(65) Prior Publication Data

US 2007/0002673 A1    Jan. 4, 2007

Related U.S. Application Data

(63) Continuation of application No. 11/018,013, filed on Dec. 20, 2004, now Pat. No. 7,164,616.

(51) Int. Cl.
    *G11C 8/00*    (2006.01)
(52) U.S. Cl. .............. 365/230.06; 365/226; 365/227; 365/228; 365/229
(58) Field of Classification Search ................ 365/226, 365/227, 228, 229, 230.06
See application file for complete search history.

(56) References Cited

U.S. PATENT DOCUMENTS 6,515,513 B2    2/2003    Ye et al.
6,862,207 B2    3/2005    Wei et al.

*Primary Examiner*—Richard T. Elms
*Assistant Examiner*—Eric Wendler

(57) ABSTRACT

Embodiments of the invention provide techniques for reducing standby power consumption due to leakage currents in memory circuits. In some embodiments, systems are provided with one or more processors having) bit cells coupled to a word-line node and to a virtual ground node. The word-line node is to be at an active word-line voltage when the row is active and an inactive word-line voltage when the row is inactive. The virtual ground node is to be at an operational ground voltage when the memory array is enabled and at an elevated voltage when the memory array is in a standby mode. There is also a word-line driver circuit coupled to the bit cells through the word-line and virtual ground nodes. The current leakage in the bit cells and word-line driver circuit is reduced during the standby mode when the virtual ground node is at the elevated voltage.

18 Claims, 4 Drawing Sheets

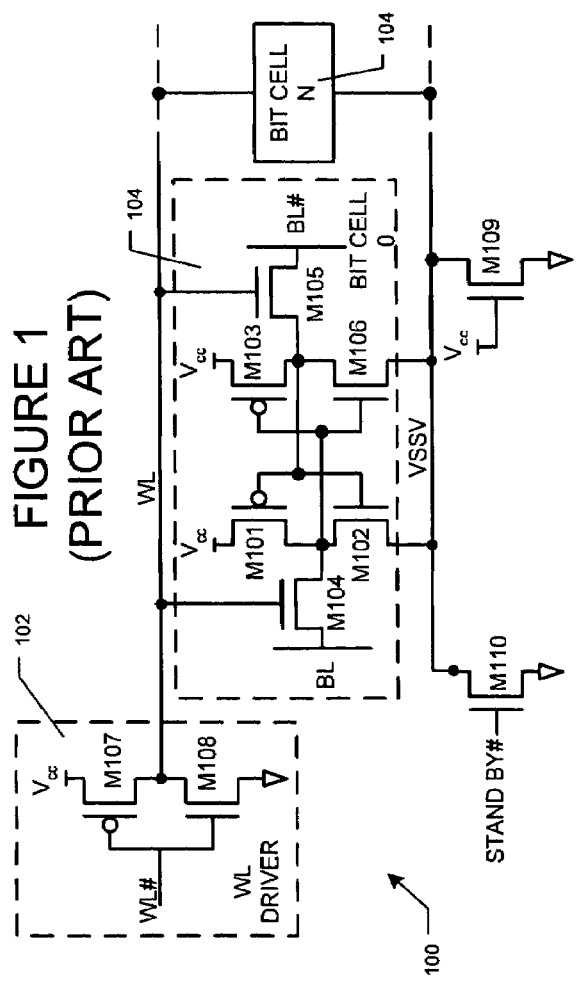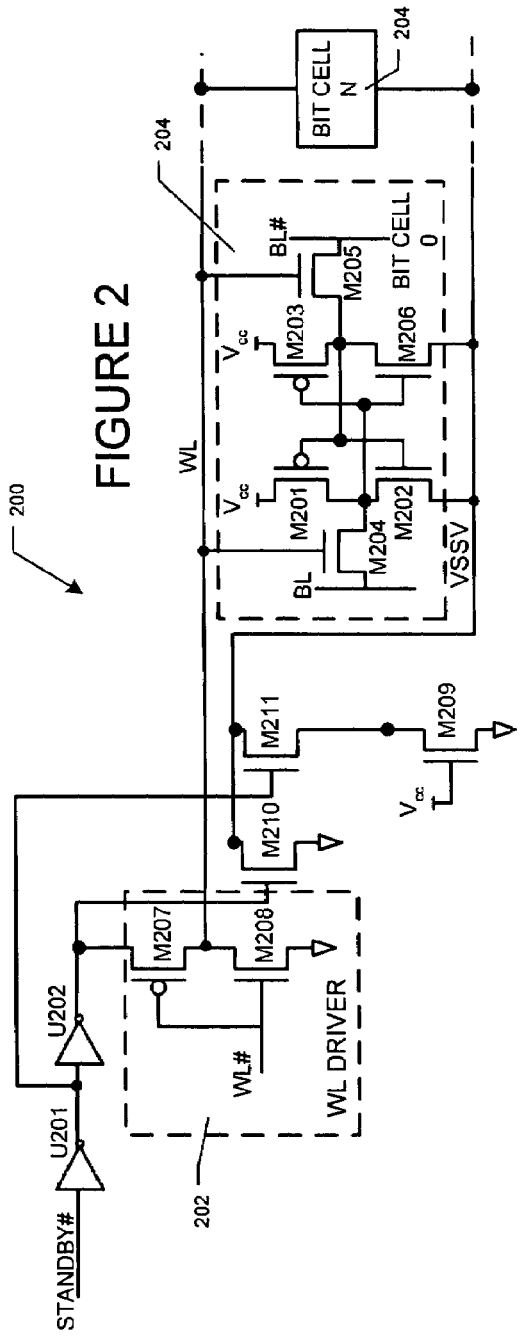

MEMORY ARRAY LEAKAGE REDUCTION CIRCUIT AND METHOD

The present application is a continuation of application Ser. No. 11/018,013, filed on Dec. 20, 2004 now U.S. Pat. No. 7,164,616 entitled "MEMORY ARRAY LEAKAGE REDUCTION CIRCUIT AND METHOD" and incorporated by reference herein.

TECHNICAL FIELD

Embodiments of the invention relate to integrated circuits and in particular to memory array circuits.

BACKGROUND

Memory array circuits are used in numerous different devices including processors, controllers, memory components, and other integrated circuit chips (chips). Unfortunately, even when they are not being used, for example, when they are in so-called "sleep modes," they can waste a considerable quantity of power due to leakage currents in their constituent transistors. With MOS transistors, for example, even when the transistors are turned off, so-called sub-threshold leakage occurs between the drain and the source and so-called gate leakage occurs between the gate and source/drain. While such leakage may not be significant for an individual transistor, overall leakage for an array of cells can quickly add up given the numerous transistors used in many array circuits. This is problematic, especially considering the prevalence of portable devices such as laptop computers, cell phones, and personal device assistants ("PDA"s) where reduced power consumption is always an important design consideration.

FIG. 1 illustrates a portion 100 of a MOS memory array with a known solution for reducing current leakage when the memory array is disabled, e.g., during a standby mode. Circuit portion 100 includes a word-line driver circuit 102, a row of bit cells 104 (BIT CELL 0 through BIT CELL N), a ground elevation transistor M109, and an operational ground transistor M110. Driver circuit 102 comprises a word-line inverter amplifier formed from transistors M107 and M108 connected as a conventional PMOS/NMOS inverter with an input at the commonly connected gates and an output at the commonly connected drains. The input is coupled to a word-line activation signal (WL#), while the output is coupled to a word-line node (WL).

A circuit for BIT CELL 0 is depicted and is representative of the other bit cells 104. It is formed from MOS transistors M101 through M107 connected, as depicted, in a conventional bit cell configuration with complementary bit lines, BL and BL#, at the drains of transistors M104 and M105, respectively. Each bit line functions as both an input and an output. Access to the bit lines is controlled by the word-line node (WL), which is connected to the gates of the bit line transistors M204, M205. The bit cell transistors are powered by a supply voltage ($V_{cc}$) and a virtual ground through a virtual ground node (VSSV). The driver circuit 102 is coupled to the row of bit cells 104 through the word line node (WL), which activates the row of bit cells 104 when the word-line inverter M107/M108 outputs a High at the word-line node in response to a Low at the word-line activation signal (WL#). Conversely, a Low voltage is output at the word-line node (WL) to deactivate the row of bit cells 104 when the word-line activation signal (WL#) is High.

Both the ground elevation transistor M109 and operational ground transistor M110 are coupled between ground and a virtual ground node (VSSV) for the row of bit cells 104. With its gate connected to a supply voltage ($V_{cc}$) the ground elevation transistor M109 is always turned on. Its size is chosen such that the potential of VSSV is nominally between 150 mV to 350 mV above the ground potential. A memory array standby signal (STANDBY#) is applied at the gate of operational ground transistor M110, which is large relative to the ground elevation transistor M109. When the array is enabled to perform an access (read or write), the STANDBY# signal is negated (High), and the large operational ground transistor M110 turns on, which pulls the virtual ground node (VSSV) sufficiently near to the ground potential for the row of bit cells 104 to operate when the word-line is active (High). Pulling the VSSV node near to ground during an array access provides higher read current and assures bit-cell stability.

On the other hand, when the array is disabled (placed in standby mode), the STANDBY# signal is asserted (Low) to turn M110 off and allow the VSSV node to return to its nominal, leakage reduction level (the value of which is dictated by transistor M109). When the array is in standby mode, the elevated virtual ground potential on VSSV reduces many of the leakage currents associated with the bit cells 104. Specifically, leakage is reduced on the four paths through M104 and M102 (BL to VSSV), M105 and M106 (BL# to VSSV), M101 and M102 ($V_{cc}$ to VSSV), and through m103 and m106 ($V_{cc}$ to VSSV). (Note that when in standby, typically, the WL node is held Low, and the BL and BL# nodes are held High.)

Unfortunately, however, this leakage reduction solution does not reduce gate leakage from the paths through M104 and M108 (BL to ground through M108) and M105 and M108 (BL# to ground through M108), and sub-threshold leakage through the path through M107 and M108 ($V_{cc}$ to ground). Accordingly, different embodiments discussed herein redress some or all of these not addressed current leakage paths.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 1 is a schematic diagram of a portion of a prior art memory array circuit with leakage reduction.

FIG. 2 is a schematic diagram of a portion of a memory array circuit, as taught in embodiments of the present invention, with leakage reduction.

DETAILED DESCRIPTION

Figure 3:
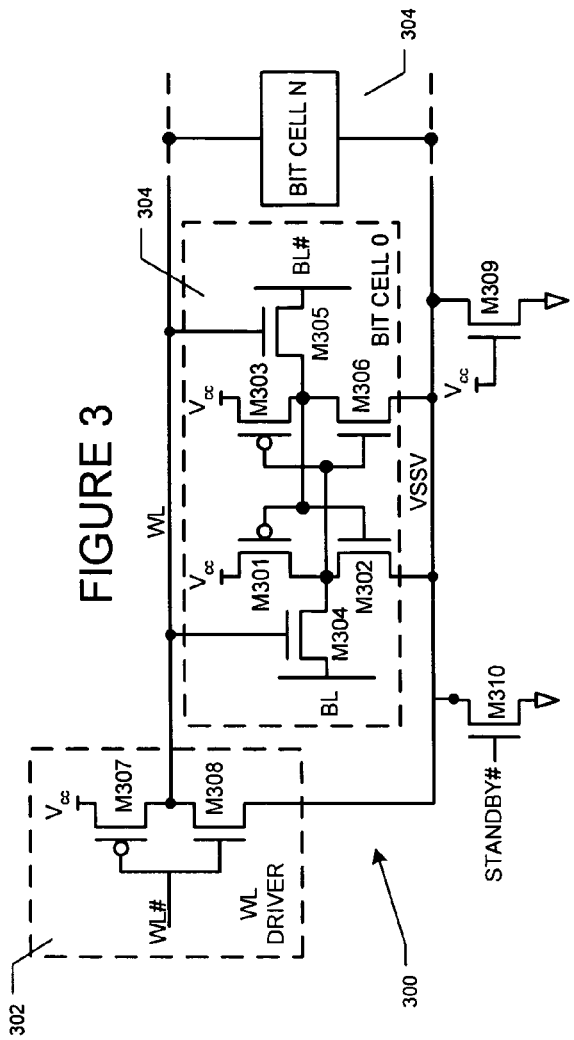
FIG. 3 is a schematic diagram of a portion of another memory array circuit, as taught in embodiments of the present invention, with leakage reduction.

Disclosed herein are techniques for reducing standby power consumption due to leakage currents in memory array circuits. With various embodiments, the disclosed techniques effectively reduce leakage paths in both bit cells and word-line driver circuits.

FIG. 2 illustrates a row portion of one embodiment of a memory array circuit 200 with reduced word-line driver, as well as bit cell, leakage. Memory circuit 200 generally includes fan-out inverters U201, U202, ground elevation transistors M209, M211, an operational ground transistor M210, and word-line rows (one being depicted) each having a driver circuit 202, bit cells 204 (BIT CELL 0 to BIT CELL N). The driver circuit 202 includes a word-line inverting amplifier (word-line inverter) formed from transistors M207 and M208 connected as a conventional PMOS/NMOS inverter with an input at the commonly connected gates and an output at the commonly connected drains. The output is coupled to a word line node (WL) and the input is coupled to a word-line activation signal (WL#). Fan-out inverters U201 and U202 are used to drive (for increased fan-out capability) a plurality of word-line drivers in the memory array in addition to the depicted word-line driver 202. They are connected in sequence, as depicted, with the input of inverter U201 coupled to a memory array standby signal (STANDBY#) and the output of inverter U202 coupled to the source of PMOS transistor M207 and to the gate of operational ground transistor M210. The word-line driver circuit 202 is coupled to the row of bit cells 204 through the word line node (WL) which activates the row of bit cells 204 when the word-line inverter (M207/M208) outputs a High at the word-line node in response to a Low at the word-line activation signal, WL#. Conversely, a Low voltage is output at the word-line node, WL, to deactivate the row of bit cells 204 when the word-line activation signal is High.

A circuit for BIT CELL 0 is depicted and is representative of the other bit cells 204. It is formed from MOS transistors M201 to M207 connected, as depicted, in a conventional bit cell configuration with complementary bit lines (BL) and (BL#) at the drains of transistors M204 and M205, respectively. Each bit line functions as both an input and an output. Access to the bit lines is controlled by the word-line node (WL) which is connected to the gates of transistors M204, M205. The bit cell transistors are powered by a supply voltage ($V_{cc}$) and a virtual ground through a virtual ground node (VSSV).

The sequential combination of ground elevation transistors, M209 and M211, are coupled between ground and the virtual ground node (VSSV). The gate of transistor M211 is coupled to the output of inverter U201, while the gate of transistor M209 is tied to $V_{cc}$ thereby maintaining it turned on. The ground elevation transistors, M209 and M211, are sized so that when they are turned on (with M210 being off), they provide at VSSV a suitable, elevated, leakage-reduction voltage (e.g., between 150 and 350 mV above ground). This occurs when the memory array is in standby mode with the STANDBY# signal asserted Low. (Note that this leakage-reduction voltage range is suitable with the depicted MOS circuit configuration with a $V_{cc}$ of about 1.2 V. It should be appreciated, however, that different leakage-reduction voltages may be suitable for these and other circuits with the same or different supply voltages depending upon particular designs and design considerations.)

The operational ground transistor M210 is also coupled between the virtual ground node (VSSV) and ground with its gate connected to the output of inverter U202. When this output goes High, M210 turns on and pulls the virtual ground node substantially down to ground. Thus, when the array is enabled to perform an access (read or write), the STANDBY# signal is negated (High) causing the operational ground transistor M210 to turn on and pull VSSV down to a sufficiently low operational ground potential for operating the row of bit cells 204. (Note that with the circuit of FIG. 1, the ground elevation transistor M109 and operational ground transistor M110 are simultaneously coupled to VSSV when the operational ground transistor M110 is turned on. In contrast, with circuit 200, when operational ground transistor M210 turns on, ground elevation transistors M209, M211 are de-coupled from VSSV by M211, whose input is a complement of the input at M210. This prevents the operational ground and ground elevation transistors from being on at the same time and "fighting" against one another at VSSV.)

In operation, the depicted memory array 200 is either enabled or in standby. If enabled, the memory array standby signal (STANDBY#) is negated (High). This causes a High to be provided at the output of U202, which serves to power the word-line driver inverter M107/M108 and to turn on operating ground transistor M210 to pull the virtual ground sufficiently down to operate the bit cells 204. When the memory array is enabled, the row of bit cells 204 can be accessed if the word-line activation (WL#) signal is asserted (Low), which causes a High to be applied at the word line node (WL). Conversely, when the word-line activation signal (WL#) is negated (High), the bit cells 204 are not accessible even though the memory is enabled.

When the memory array is in standby mode, the memory array standby signal (STANDBY#) is asserted (Low). When this occurs, a Low is applied at the source of M207 thereby removing supply power from the word-line inverter M207/M208, which reduces the sub-threshold current leakage passing through M207 and M208. (This is in contrast to the circuit of FIG. 1 where the word-line driver is powered during standby mode.) In addition, operating ground transistor M210 turns off and ground elevation transistor M211 turns on and, in cooperation with the ground elevation transistor M209, provides an elevated, leakage reduction voltage at the virtual ground node (VSSV). As discussed in connection with the circuit of FIG. 1, this reduces both gate and sub-threshold leakage in the bit cells 204. Accordingly, the memory circuit of FIG. 2, when in standby mode, redresses current leakage in both the word line driver, as well as in the bit cells.

It should be appreciated that standby modes for memory arrays, as discussed herein, can be used in a variety of different ways. For example, with processors, memory chips or other devices used in components such as laptop computers, cell phones, or other portable devices, they could be used in association with a so-called "sleep" or "hibernation" mode when the component is not being used. Alternatively, they could be used at any time when memory is not being accessed such as during portions of read or write cycles when the memory array is not actually being accessed (e.g., when data is being transferred).

FIG. 3 illustrates a portion of a memory array circuit 300 that utilizes another approach for reducing leakage currents. Memory array circuit 300 generally includes a ground elevation transistor M309, an operational ground transistor M310, and word-line rows each including a word-line driver circuit 302 and bit cells 304 (BIT CELL 0 to BIT CELL N). (Note that for this and following embodiments, the word-line driver circuit 302, bit cells 304 and associated STANDBY# and WL# signals are configured and operate similarly as those in the circuit of FIG. 2, so they will not be addressed in detail except, possibly, where differences of interest exist.

Unlike with the circuit of FIG. 2, the word-line driver inverter M307/M308 is connected to a supply voltage, $V_{cc}$ that is not removed during standby mode. Instead of reducing sub-threshold leakage by removing power during standby, it is reduced by using the virtual ground (VSSV) as its ground to impede leakage current paths that would otherwise pass through transistor M308 during standby. As depicted, the virtual ground node (VSSV), whose voltage level is dictated by operational ground transistor M310 and ground elevation transistor M309 as previously discussed, is coupled to the source of M308, as well as to the bit cell sources M302, M306. Thus, when in STANDBY MODE (STANDBY# Low), M310 turns off, and the elevated, virtual ground voltage (e.g., 150 to 350 mV above ground) is applied at VSSV thereby functioning, from the ground side, to reduce leakage current in both the word-line driver 302 and bit cells 304. Note that with this solution, not only are the bit cell leakage currents and word-line driver sub-threshold leakage currents (M307 through M308) reduced, but also, gate leakage from M304/M305 through M308 is also reduced.

When the memory array is enabled (STANDBY# High), M310 turns on to pull the virtual ground node (VSSV) down to an operational ground for operating both the word-line driver 302 and the bit cells 304. When he memory array is enabled, however, there is a drawback with this circuit during an active array read access. The voltage at the VSSV node is necessarily lower than that at the WL nodes (for the multiple rows, not depicted, in the memory array) that are driven low through transistor M308. The higher voltage, relative to VSSV, on inactivated WL nodes may contribute to sub-threshold conduction from unselected bit cells (through transistors M304 and M305) and degrade a read differential signal across BL and BL#. This could be mitigated by limiting the number of bit-cells on a column (i.e., number of word-line rows), but this has a negative impact on array density. The approaches in the following embodiments solve this problem yet retain the comprehensive leakage reduction benefits associated with circuit 300.

Figure 4:
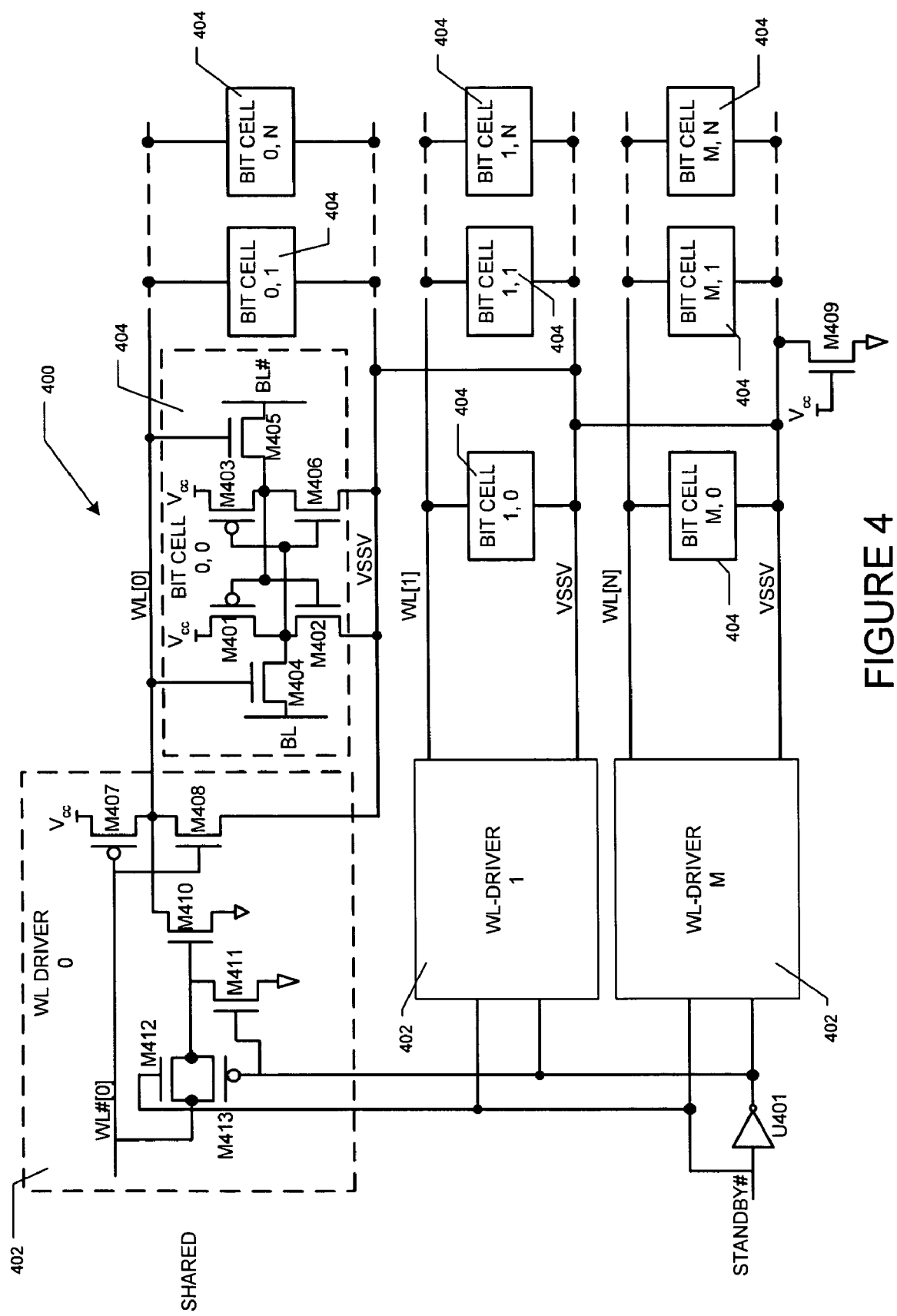
FIG. 4 is a schematic diagram of a portion of another memory array circuit, as taught in embodiments of the present invention, with leakage reduction.

FIG. 4 illustrates a portion of a memory array circuit 400 that utilizes yet another approach for reducing leakage currents. Memory array circuit 400 generally includes a ground elevation transistor M409, an inverter U401, and word-line rows (0 to M) each including a word-line driver circuit 402 and bit cells 404 (0 to N). (Note that the VSSV nodes for the bit cells 404 in the different rows are coupled to one another, i.e., they form a common VSSV node within the memory array 400.)

A circuit for the word-line driver (WL DRIVER 0) is depicted and is representative of the other word-line drivers (0 to M). It includes word-line inverter M407/M408, an operational ground transistor M410, a turn-off transistor M411, and a pass-gate M412/M413. Word-line inverter M407/M408 is powered with Vcc coupled to the source of PMOS transistor M407 with the virtual ground node (VSSV) coupled to the source of NMOS transistor M408. The word-line activation signal (WL#) is applied at its input, and its output is coupled to the word-line node (WL). The pass-gate M412/M413 is controlled by the STANDBY# signal, which is coupled to its NMOS gate (M412) with an inverted form of it (by way of inverter U401) coupled to its PMOS gate (M413). The word-line activation signal (WL#) is applied at its input, and its output is coupled to the gate of the operational ground transistor M410. The turn-off transistor M411 is coupled between the gate of operational ground transistor M410 and ground with its gate coupled to an inverted form of STANDBY# (at the output of inverter U401). Memory array circuit 400 operates in the following manner.

In standby, the STANDBY# signal is asserted (Low), which turns off pass-gate M412/M413 to de-couple the word-line activation signal (WL#) from the operational ground transistor M410. The inverted STANDBY# signal also causes the turn-off transistor M411 to turn on, which causes operational ground transistor M410 to be off during standby. Thus in standby, the VSSV node voltage is determined by the ground elevation transistor M409, which is sized to provide a sufficiently elevated, leakage-reduction voltage (e.g., 150 to 350 mV above ground) on VSSV for reduced leakage in both the word-line drivers and bit cells.

When the memory array 400 is enabled, the STANDBY# signal is NEGATED (High), and thus the pass-gate (M412/M413) is turned on, while turn-off transistor M411 turns off thereby allowing the operational ground transistor M410 to turn on or off depending on the state of the word-line activation signal (WL#). When a word-line row is to be inactive, WL# is negated (High), which causes the word-line inverter M407/M408 to output a Low at the WL node and the operational ground transistor M410 to turn on thereby pulling the WL node down close to ground. (In fact, in the depicted embodiment, it pulls it down to a voltage less than that at the VSSV thereby preventing the sub-threshold, read-access signal degradation problems discussed with regard to the previous figure.)

When a row of bit cells is accessed, the WL# signal (for that row) is activated (asserted Low), which causes the word-line inverter M407/M408 to output a High at the word-line node (WL). It also turns off the operational ground transistor M410. Note that the other M−1 word-line drivers, being de-activated, will drive their WL nodes Low, and their operational ground transistors M410 will be turned on. Thus, in those de-activated (inactive) word-line rows, transistors M410 pull the WL nodes down near to the ground voltage. These Low WL nodes serve to drive the common VSSV node (for the entire array) down near to the ground voltage, as well, through the parallel combination of all of the turned on M408 transistors from all of the de-activated word-line drivers. Thus, for the activated word-line row, the VSSV-to-ground conduction path in the de-activated M−1 word-line drivers occurs from VSSV through the turned on M408 transistors to the de-activated WL nodes and on through the turned on operational ground transistors M410 to ground. This provides a sufficient operational ground at VSSV for the activated row, and it assures that the de-activated WL nodes are driven to a lower voltage than the VSSV node to eliminate the sub-threshold read-access signal degradation problem discussed with regard to the previous figure.

Figure 5:
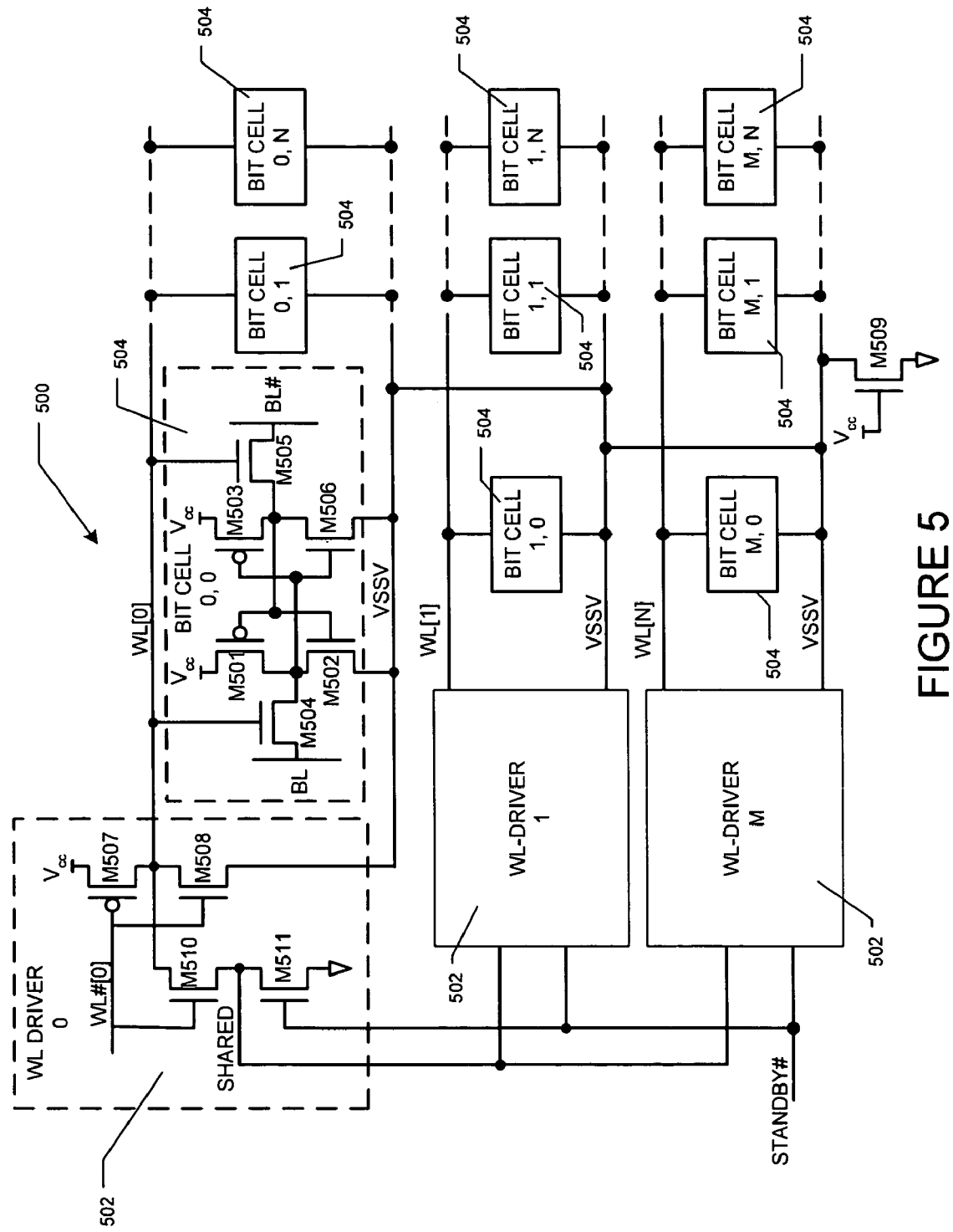
FIG. 5 is a schematic diagram of a portion of another memory array circuit, as taught in embodiments of the present invention, with leakage reduction.

FIG. 5 illustrates a portion of a memory array circuit 500, utilizing another approach for reducing leakage currents, according to another embodiment of the present invention. Memory array circuit 500 generally includes a ground elevation transistor M509 and word-line rows (0 to M) each including a word-line driver circuit 502 (0 to M) and bit cells 504 (0 to N). (Note that as with the previously discussed circuit embodiment, the VSSV nodes for the bit cells 504 in the different rows are coupled to one another, i.e., they form a common VSSV node within the memory array 500.)

A circuit for the word-line driver (WL DRIVER 0) is depicted and is representative of the other word-line drivers (0 to M). It includes a word-line inverter M507/M508, an operational ground transistor M510, and a blocking transistor M511. The word-line inverter M507/M508 is powered with Vcc coupled to the source of PMOS transistor M507 and the virtual ground node (VSSV) coupled to the source of NMOS transistor M508. The word-line activation signal (WL#) is applied at its input, and its output is coupled to the word-line node (WL). The stacked combination of the operational ground transistor M510 and the blocking transistor M511 are coupled between the word-line node (WL) and ground. The word-line activation signal (WL#) is coupled to the gate of the operational ground transistor M510, and the standby signal (STANDBY#) is coupled to the gate of the blocking transistor M511. (Note that in the depicted embodiment, the node that couples M510 to M511, labeled SHARED, is a common, shared node between all of the word-line driver circuits 502 in the memory array circuit 500.) Memory array circuit 500 operates in the following manner.

In standby, the STANDBY# signal is asserted (Low), which turns off blocking transistor M511 to effectively turn off the operational ground transistor M510. Thus, the VSSV node voltage is determined by the ground elevation transistor M509, which is sized to provide a sufficiently elevated, leakage-reduction voltage (e.g., 150 to 350 mV above ground) on VSSV during standby mode. Accordingly, in standby, the elevated virtual ground node (VSSV) reduces leakage in both the word-line drivers and bit cells of memory array 500.

When the memory array 500 is enabled, the STANDBY# signal is NEGATED (High), and thus the blocking transistor M511 is turned on thereby allowing the operational ground transistor M510 to turn on or off depending on the state of the word-line activation signal (WL#). When a word-line is inactive, WL# is negated (High) causing the word-line inverter M507/M508 to output a Low at the WL node. It also causes the operational ground transistor M510 to turn on thereby pulling down the WL node near to ground (through M511 and M510). (In fact, in the depicted embodiment, it pulls it down to a voltage less than that at the VSSV thereby preventing the sub-threshold, read-access signal degradation problems discussed with regard to FIG. 3.)

When a word-line row of bit cells is accessed, the WL# signal (for that row) is activated (asserted Low), which causes the word-line inverter M507/M508 to output a High at the word-line node (WL). It also turns off the operational ground transistor M510. Note that the other M−1 word-line drivers, being de-activated, will drive their WL nodes Low, and their operational ground transistors M510 will be turned on. Thus, in those de-activated rows (inactive word-line rows), transistors M510 and M511 pull the WL nodes down near to the ground voltage. These Low WL nodes serve to drive the common VSSV node (for the entire array) down near to the ground voltage, as well, through the parallel combination of all of the turned on M508 transistors in all of the de-activated word-line drivers. Thus, for the activated row of bit cells 504, the VSSV-to-ground path occurs in the M−1 de-activated word-line drivers from VSSV through the turned on M508 transistors to the WL nodes and on through the turned on M510/M511 stacks to ground. This provides a sufficient operational ground at VSSV for the activated row, and it assures that the de-activated WL nodes are driven to a lower voltage than the VSSV node to eliminate the sub-threshold read-access signal degradation problem discussed with regard to FIG. 3. (Note that the circuit configuration of FIG. 5 may be preferred over the circuit of FIG. 4 because the word line driver layout is more compact. In the depicted embodiment, the SHARED node is merged across all of the word-line drivers to achieve even greater compactness.)

Additional Remarks

It should be appreciated that the present invention is applicable for use with all types of semiconductor chips that may be fabricated using complementary metal-oxide semiconductor ("CMOS") technology. Examples of these chips include but are not limited to processors, controllers, chip set components, programmable logic arrays (PLA), and other types of memory arrays, such as dynamic random access memory (DRAM), static random access memory; (SRAM), and video random access memory (VRAM).

Figure 6:
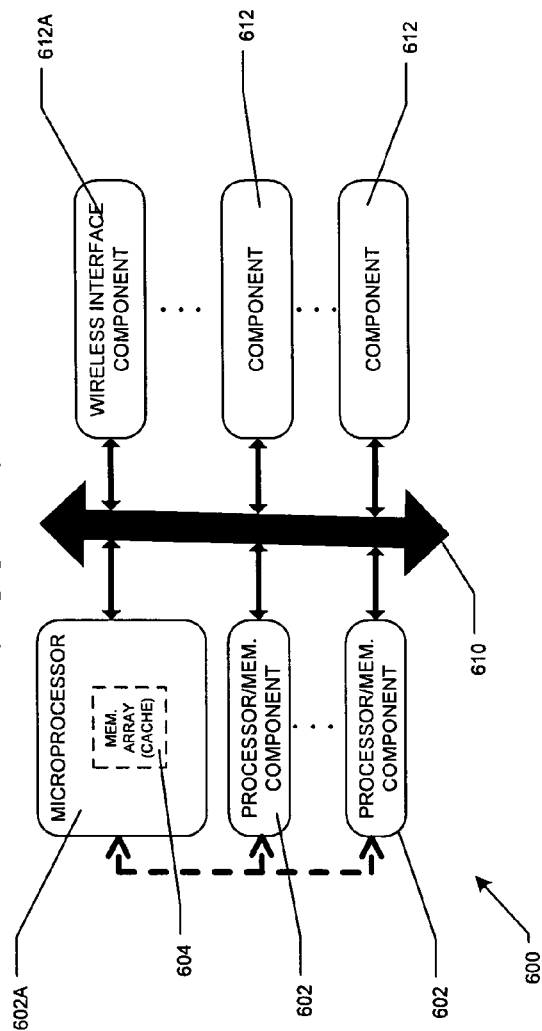
FIG. 6 is a block diagram of a system having a processor chip with a memory array circuit, as taught in embodiments of the present invention, with leakage reduction.

With reference to FIG. 6, one example of a system (a system 600 for a computer) for using such a chip (a microprocessor chip 602A) is shown. System 600 generally comprises one or more processor/memory components 602, an interface 610, and one or more other components 612. At least one of the one or more processor/memory components 602 is coupled to at least one of the one or more other components 612 through the interface 610, which could comprise an interconnect or multiple interconnects and/or interconnect devices. A processor/memory component is a component such as a processor, controller, memory array, or combinations of the same contained in a chip or in several chips mounted to the interface or in a module or circuit board coupled to the bus. Included within the depicted processor/memory components is microprocessor chip 602A, which has a memory array cache 604 configured in accordance with a memory array discussed herein with reduced standby leakage. The one or more depicted other components 612 could include any component of use in a computer system such as a sound card, network card, Super I/O chip, processor/memory component, or the like. In the depicted embodiment, the other components 612 include a wireless interface component 612A, which serves to establish a wireless link between the microprocessor 602A and another device such as a wireless network interface device or a computer.

It should be noted that the system 600 could be implemented in different forms. That is, it could be implemented in a single chip module, a circuit board, or a chassis having multiple circuit boards. Similarly, it could constitute one or more complete computers or alternatively, it could constitute a component useful within a computing system.

It should also be appreciated that example sizes/models/values/ranges may have been given, although the present invention is not limited to the same. As manufacturing techniques (e.g., photolithography) mature over time, it is expected that devices of smaller size could be manufactured. With regard to description of any timing or programming signals, the terms "assertion" and "negation," if used, are used in an intended generic sense. More particularly, such terms are used to avoid confusion when working with a mixture of "active-low" and "active-high" signals, and to represent the fact that the invention is not limited to the illustrated/described signals, but can be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. In addition, well known power/ground connections to chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A system, comprising:
   (a) a microprocessor having a memory array with word-line rows each including: (i) bit cells coupled to a word-line node and to a virtual ground node, the word-line node to be at an active word-line voltage when the row is active and an inactive word-line voltage when the row is inactive, the virtual ground node to be at an operational ground voltage when the memory array is enabled and at an elevated voltage when the memory array is in a standby mode, and (ii) a word-line driver circuit coupled to the bit cells through the word-line and virtual ground nodes, wherein current leakage in the bit cells and word-line driver circuit is reduced during the standby mode with the virtual ground node being at the elevated voltage; and
   (b) a wireless interface component to be coupled to the microprocessor chip to establish a wireless link between the microprocessor and a device outside of the system.

2. The system of claim 1, in which the inactive word-line voltage is less than or equal to the operational ground voltage when the memory array is enabled and the row is inactive.

3. The system of claim 2, in which the word-line driver circuit includes: (i) a word-line amplifier coupled between a voltage supply terminal and the virtual ground node and having an output coupled to the word-line node to provide the active word-line voltage when the row is active, and (ii) an operational ground transistor coupled between the word-line node and a ground to substantially couple the word-line node to the ground when the row is inactive and the memory array is enabled, the word-line node being at a voltage that is less than or equal to the voltage at the virtual ground node when the word-line node is coupled to the ground.

4. The system of claim 3, in which the word-line amplifier comprises a word-line inverter.

5. The system of claim 4, in which the operational ground transistor is coupled between the word-line node and a blocking transistor coupled to the ground, wherein the blocking transistor is turned on when the memory array is enabled, and the operational ground transistor turns on when the row is inactive.

6. The system of claim 5, in which the operational ground transistor comprises an NMOS transistor with its drain coupled to the word-line node, its source coupled to the blocking transistor, and its gate coupled to the word-line activation node to turn on the operational ground transistor when the row is inactive and the memory array is enabled.

7. The system of claim 4, in which the operational ground transistor is coupled between the word-line node and a direct connection to the ground.

8. The system of claim 4, in which the virtual ground node is common to all of the word-line rows.

9. The system of claim 8, in which the virtual ground node, when the memory array is enabled, is coupled to the ground through the word-line inverters and operational ground transistors in word-line rows that are inactive.

10. The system of claim 1, in which the bit cells have complementary input/output bit lines.

11. The system of claim 1, in which the elevated leakage reduction voltage at the virtual ground node is at a value in the range of 150 to 350 milli-volts.

12. A system, comprising:
   (a) a microprocessor having memory comprising: (i) bit cells coupled to a word-line node and to a virtual ground node, the virtual ground node to be at an operational ground level when the memory is enabled and at an elevated level when the memory is in a standby mode, and (ii) a word-line driver coupled to the word-line and virtual ground nodes, wherein leakage in the bit cells and word-line driver is inhibited during the standby mode; and
   (b) a memory component to be coupled to the microprocessor chip.

13. The system of claim 12, in which the memory component comprises a dynamic random access memory component.

14. The system of claim 12, in which the word-line driver includes: (i) a word-line amplifier coupled between a voltage supply terminal and the virtual ground node and having an output coupled to the word-line node to provide an active word-line voltage, and (ii) an operational ground transistor coupled between the word-line node and a ground to substantially couple the word-line node to the ground when the bit cells are inactive.

15. The system of claim 14, in which the word-line node is to be at a voltage that is less than or equal to the voltage at the virtual ground node when the word-line node is coupled to the ground.

16. The system of claim 14, in which the word-line amplifier comprises a word-line inverter.

17. The system of claim 14, in which the operational ground transistor is coupled between the word-line node and a blocking transistor coupled to the ground, wherein the blocking transistor is turned on when the memory is enabled, and the operational ground transistor turns on when the bit cells are inactive.

18. The system of claim 17, in which the operational ground transistor comprises an NMOS transistor with its drain coupled to the word-line node, its source coupled to the blocking transistor, and its gate coupled to the word-line activation node to turn on the operational ground transistor when the row is inactive and the memory array is enabled.

* * * * *